United States Patent
Nagakubo et al.

(10) Patent No.: US 8,729,497 B2
(45) Date of Patent: May 20, 2014

(54) SAMPLE DEVICE FOR CHARGED PARTICLE BEAM

(75) Inventors: Yasuhira Nagakubo, Hitachinaka (JP);
Toshiaki Tanigaki, Hitachinaka (JP);
Hideki Hirota, Hitachinaka (JP);
Katsuji Ito, Hitachinaka (JP); Takayuki Asakawa, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 13/877,947

(22) PCT Filed: Oct. 5, 2011

(86) PCT No.: PCT/JP2011/072994
§ 371 (c)(1),
(2), (4) Date: Apr. 5, 2013

(87) PCT Pub. No.: WO2012/046775
PCT Pub. Date: Apr. 12, 2012

(65) Prior Publication Data
US 2013/0193343 A1    Aug. 1, 2013

(30) Foreign Application Priority Data
Oct. 7, 2010  (JP) .................................. 2010-227345

(51) Int. Cl.
*H01J 37/20* (2006.01)
*H01J 37/26* (2006.01)

(52) U.S. Cl.
USPC ................. 250/441.11; 250/442.11; 250/311; 250/491.1; 250/492.3

(58) Field of Classification Search
USPC .......... 250/441.11, 442.11, 311, 491.1, 492.3
See application file for complete search history.

(56) References Cited

U.S. PATENT DOCUMENTS

| | | | |
|---|---|---|---|
| 7,227,140 B2* | 6/2007 | Skidmore et al. | 250/307 |
| 8,410,457 B2* | 4/2013 | Terada et al. | 250/491.1 |
| 2007/0187623 A1* | 8/2007 | Skidmore et al. | 250/492.21 |

FOREIGN PATENT DOCUMENTS

| | | |
|---|---|---|
| JP | 4-92362 U | 8/1992 |
| JP | 6-076777 A | 3/1994 |
| JP | 11-213931 A | 8/1999 |
| JP | 2001-153760 A | 6/2001 |
| JP | 2001-291483 A | 10/2001 |
| JP | 2007-108149 A | 4/2007 |
| JP | 2010-067468 A | 3/2010 |

* cited by examiner

Primary Examiner — Nikita Wells
(74) Attorney, Agent, or Firm — Miles & Stockbridge P.C.

(57) ABSTRACT

Provided is a sample device for a charged particle beam, which facilitates the delivery of a sample between an FIB and an SEM in an isolated atmosphere. An atmosphere isolation unit 10 for putting a lid 9 on an atmosphere isolation sample holder 7 isolated from the air and taking the lid 9 off the sample holder, is provided in a sample exchanger 5 that communicates with a sample chamber 4 of the FIB 1 or the SEM through a gate; and the lid 9 is taken off only by pushing a sample exchange bar 11, and thereby only the sample holder 7 is set in the sample chamber 4. The sample is loaded in the atmosphere isolation sample holder 7 in an atmosphere isolated from the air, for example, in a vacuum, and then the sample is isolated from the outside air by putting the lid 9 on the sample holder; the sample can be processed and observed in the FIB 1 or the SEM only by pushing the sample exchange bar 11 in this state, and further, when the sample exchange bar 11 is pulled out, by putting the rid of the sample holder in the atmosphere isolation unit 10, the state of isolation between the sample and the outside air.

15 Claims, 7 Drawing Sheets (a)

(b)

(c)

SAMPLE DEVICE FOR CHARGED PARTICLE BEAM

TECHNICAL FIELD

The present invention relates to a sample device for a charged particle beam and more particularly to the sample device suitable for the delivery of a sample between a focused-ion-beam processing device (hereinafter referred to as "FIB") and a scanning electron microscope (hereinafter referred to as "SEM").

BACKGROUND ART

Conventionally the following process has been widely employed: an FIB is used for fine processing of a sample and the fine-processed sample is observed with an SEM; when there is observed a defect or the like, it is analyzed by observation with the SEM, and then the sample is returned to the FIB to be processed again. For this process, the delivery of the sample between a sample chamber of the FIB and a sample chamber of the SEM is necessary and various sample devices have been proposed to cope with various problems including a problem caused by a vacuum sample chamber and a problem in connection with positioning for fine processing and observation of a sample.

For example, Patent Document 1 proposes that, in order to facilitate identification of an area (or areas) to be processed on a sample with an FIB or an area (or areas) to be observed on the sample with an SEM when delivering the sample, information necessary therefor is pre-stored in a sample cartridge for carrying the sample, and positioning for the sample can be done only by loading the sample cartridge on the FIB or SEM.

LIST OF PRIOR ART REFERENCE

Patent Document

Patent Document 1: JP 2001-291483A

SUMMARY OF INVENTION

Technical Problem to be Solved

In recent years, research and development for Li ion batteries have been actively performed, and an FIB and an SEM which use charged particle beams have been used to observe and analyze the materials used for electrodes of Li ion batteries. Li has a very high activity and has a tendency to easily react with moisture in the atmospheric air. Therefore, during the delivery of electrodes as a sample, for example, when the sample is delivered from the FIB to the SEM, the atmosphere in which Li is held must be kept in vacuum or an inert gas atmosphere such as an Ar gas atmosphere.

However, in the past, there have been no techniques of keeping the most favorable atmosphere for the sample between the FIB and the SEM using charged particle beams as mentioned above nor sample devices that isolated the atmosphere therebetween.

From now on, it can be expected that the needs of observation and analysis for a highly active material such as Li by using charged particle beams will grow in the future, and it can be expected also that the needs for an adjustable sample atmosphere will grow in the future.

The preset invention has been made in view of these recent needs, and an object thereof is to provide a sample device for a charged particle beam, the sample device capable of facilitating the delivery of a sample between an FIB and a SEM in an isolated atmosphere.

Solution to Problem

In order to achieve the above object, the present invention is characterized by comprising: in a sample device for a charged particle beam which delivers a sample between a focused ion beam processing system (FIB) and a scanning electron microscope (SEM), comprising: a sample exchanger communicating with a sample chamber of the FIB or a sample chamber of the SEM, and the sample exchanger capable of forming an atmosphere isolated from an outside air therein; and an atmosphere isolation sample holder configured to hold the sample while isolating the sample from the outside air with a lid being put on the sample holder; wherein the sample exchanger is provided with a lid removing mechanism configured to, when the sample holder with the lid is carried from the sample exchanger into the sample chamber, remove the lid from the sample holder inside the sample exchanger, and thereby to make it easy to deliver, process and observe the sample in the isolated atmosphere.

As other features of the present invention, the sample exchanger can be provided for both of the FIB and the SEM, and also the concrete structure of the sample exchanger and the structure of the atmosphere isolation sample holder, be apparent from the following description of embodiments

Advantageous Effects of Invention

According to the present invention, since the sample can be easily delivered in the atmosphere isolated from the outside air, even if the sample is highly active and easily trend to react with moisture and oxygen in the atmospheric air, a series of steps from processing of the material to be sample to its observation and analysis can be carried out without exposure to the atmospheric air.

BRIEF DESCRIPTION OF DRAWINGS

FIG. 2 illustrates an embodiment of a sample exchanger according to the present invention, wherein FIG. 2(a) is a sectional view illustrating that an atmosphere isolation sample holder is being loaded, FIG. 2(b) is a sectional view illustrating that the atmosphere isolation sample holder is loaded, and FIG. 2(c) is a side view illustrating that the atmosphere isolation sample holder is loaded.

FIG. 3 is a view which explains operation for carrying the atmosphere isolation sample holder according to an embodiment of the invention, wherein FIG. 3(a) is a side view illustrating that the atmosphere isolation sample holder is carried in, FIG. 3(b) is a side view of the atmosphere isolation sample holder with a lid removed, and FIG. 3(c) is a side view of the atmosphere isolation sample holder carried into a sample chamber.

FIG. 4 illustrates an embodiment of an atmosphere isolation unit according to the present invention, wherein FIG. 4(a) is a top view of the atmosphere isolation unit, FIG. 4(b) is a sectional view of the atmosphere isolation unit, and FIG. 4(c) a side view of the atmosphere isolation unit.

FIG. 5 illustrates an embodiment of the atmosphere isolation sample holder according to the present invention, wherein FIG. 5(a) is a top view of the atmosphere isolation sample holder, FIG. 5(b) is a sectional view of the atmosphere isolation sample holder, and FIG. 5(c) is a sectional view of the atmosphere isolation sample holder.

FIG. 6 illustrates another embodiment of the atmosphere isolation sample holder according to the present invention, wherein FIG. 6(a) is a top view of the atmosphere isolation sample holder, FIG. 6(b) is a sectional view of the atmosphere isolation sample holder, and FIG. 6(c) is a sectional view of the atmosphere isolation sample holder.

FIG. 7 illustrates an embodiment of the replaceable sample stage according to the present invention, wherein FIG. 7(a) is a top view of the replaceable sample stage and FIG. 7(b) is a sectional view of the replaceable sample stage.

FIG. 8 illustrates another embodiment of the replaceable sample stage according to the present invention, wherein FIG. 8(a) is a top view of the replaceable sample stage and FIG. 8(b) is a sectional view of the replaceable sample stage.

FIG. 9 illustrates another embodiment of the replaceable sample stage according to the present invention, wherein FIG. 9(a) is a top view of the replaceable sample stage and FIG. 9(b) is a sectional view of the replaceable sample stage.

DESCRIPTION OF EMBODIMENTS

Next, an embodiment of the present invention will be described referring to drawings.

Figure 1:
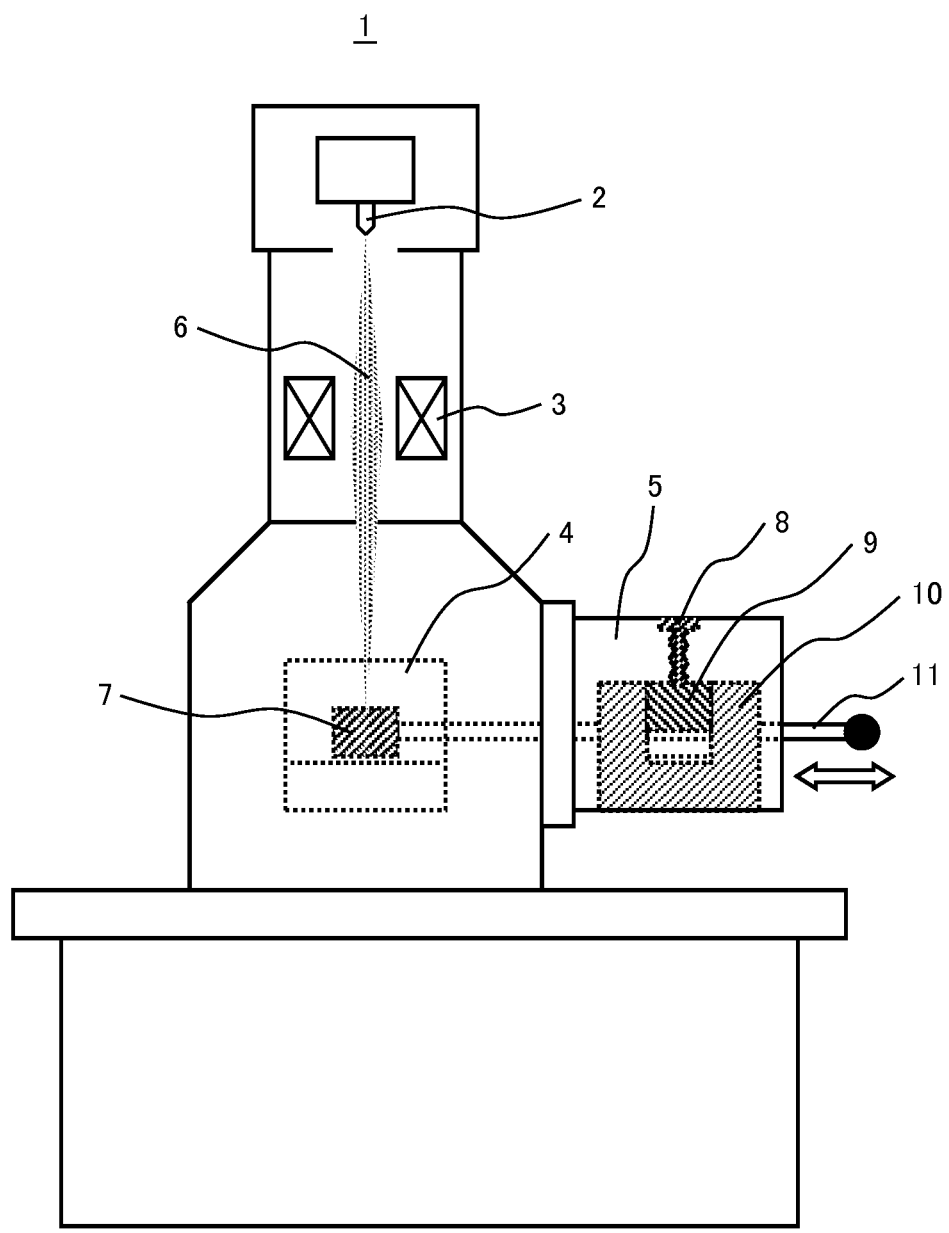
FIG. 1 is a diagram of the basic configuration of an embodiment of a focused-ion-beam processing device to which the present invention is applied.

FIG. 1 illustrates the basic configuration of an atmosphere isolation system for an FIB according to an embodiment of the present invention. A housing 1 of the FIB includes an ion gun 2, an electrostatic lens 3, a sample chamber 4, and a sample exchanger 5. An ion beam 6 emitted from the ion gun 2 is focused with the electrostatic lens 3 and applied on a sample. An atmosphere isolation sample holder 7 is configured to be inserted into and pulled out of the sample chamber 4. The insertion and pulling out for the sample holder is performed by sliding the sample holder 7 by pushing and pulling an exchange bar 11 through the sample exchanger 5 communicating with the sample chamber.

Here, the sample chamber 4 and the sample exchanger 5 communicate with each other through a gate. The exchange bar 11 is configured to, after the sample holder 7 is carried into the sample chamber 4 by pushing the exchange bar, be separated from the sample holder and pulled back into the sample exchanger 5, so the gate can be shut to perform FIB processing or the like. The atmosphere isolation sample holder 7 is screwed on a tip-side portion of the exchange bar 11 so as to be attachable to and detachable from the exchange bar. More specifically, for example, at least the tip-side portion of the exchange bar 11 is threaded to form a male thread, and the sample holder 7 has a screw hole 13 (female thread: see FIG. 2) which matches up with the male thread of the tip-side portion of the exchange bar 11. The sample holder 7 can be screwed on the tip-side portion of the exchange bar 11 by turning the exchange bar 11 to tighten the tip-side thread portion into the screw hole 13. The sample holder 7 can be detached from the exchange bar 11 by turning the exchange bar 11 in a direction opposite to the screw tightening direction with the sample holder 7 in a fixed state of the sample holder. On one side of the sample exchanger 5 which is opposite to its side communicating with the sample chamber 4, the exchange bar 11 is inserted into the sample exchanger 5 through a sealing mechanism such as an O ring.

The sample exchanger 5 is configured to produce a vacuum therein with a vacuum pump provided at the FIB housing 1 side or introduce an inert gas or the like thereinto, in a gate closing state between the sample exchanger and the sample chamber 4. Therefore, the inside of the sample exchanger 5 can be an atmosphere isolated from the outside air independently of the sample chamber 4.

Inside the sample exchanger 5, an atmosphere isolation unit 10 is securely fixed by an atmosphere isolation unit fixing device 8 and an atmosphere isolation sample holder lid 9 is attached to or detached from the atmosphere isolation sample holder 7 through the atmosphere isolation unit 10.

When processing a sample, the atmosphere isolation sample holder 7 is screwed onto the exchange bar 11, and only the atmosphere isolation sample holder 7 is carried to the sample chamber 4 through the atmosphere isolation unit 10 in the sample exchanger 5, with the exchange bar 11.

At this time, the atmosphere isolation sample holder lid 9 is left in the sample exchanger 5 as shown in the figure.

In order to take out the atmosphere isolation sample holder 7 from the sample chamber after processing the sample, the atmosphere isolation sample holder 7 is screwed onto the exchange bar 11 and pulled back so that the atmosphere isolation sample holder lid 9 is attached onto the sample holder 7 in the sample exchanger 5, and thereby the sample holder is taken out from the sample chamber 4 while the atmosphere in the sample chamber 4 is maintained.

Although FIG. 1 illustrates the FIB housing, similarly another sample exchanger 5 is coupled to the SEM housing through a gate so that an atmosphere isolated from the external air can be formed independently of the sample chamber 4 of the SEM.

Figure 2:
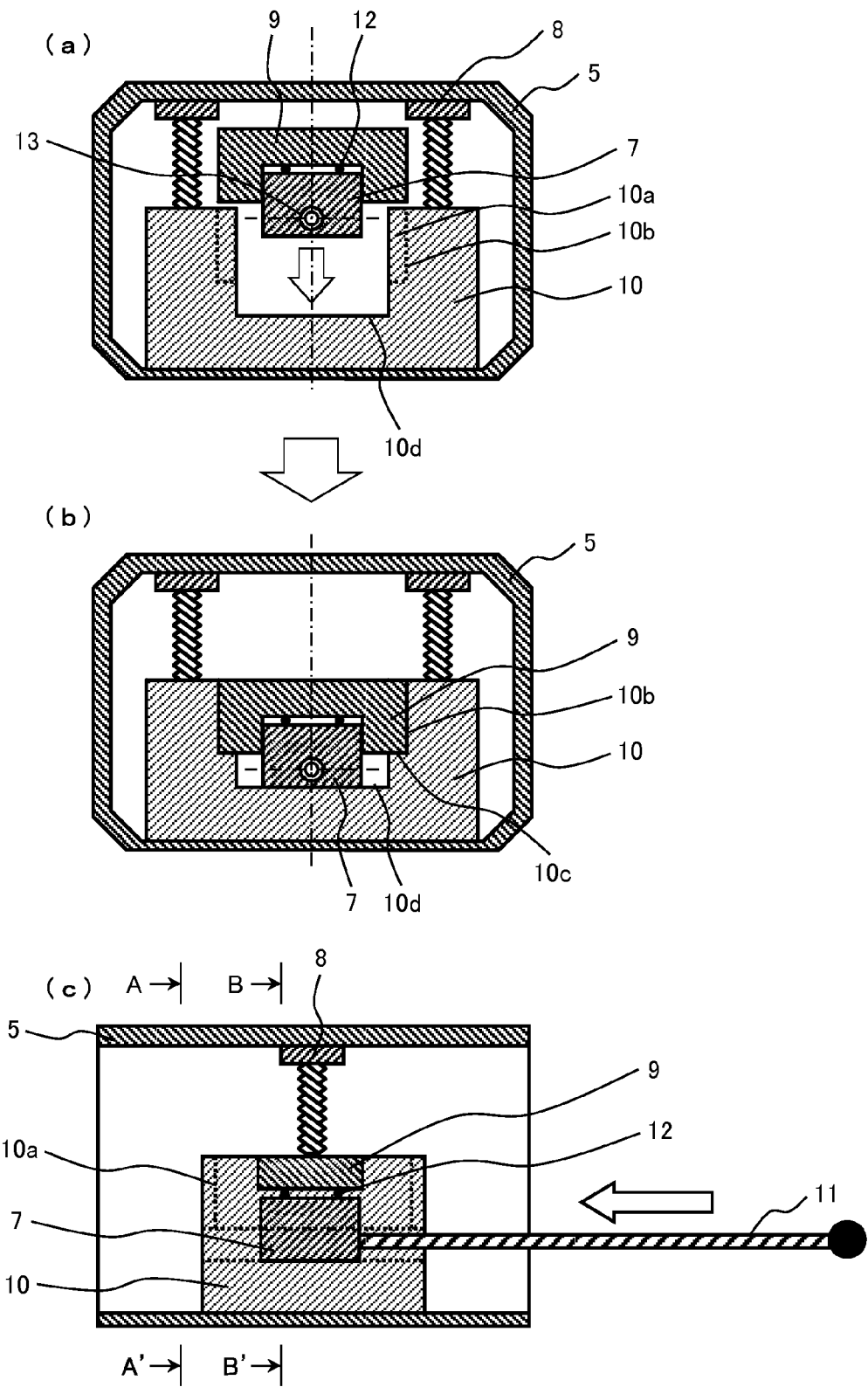

FIG. 2 illustrates the internal structure of the sample exchanger 5. The atmosphere isolation unit 10 is securely fixed in the sample exchanger 5 with the atmosphere isolation unit fixing device 8. The atmosphere isolation sample holder 7 and the lid 9 are configured to slide together in the atmosphere isolation unit up to the predetermined position, and the lid 9 is configured to be attached to or detached from the sample holder at the predetermined position. FIG. 2(a) is a sectional view taken along the line A-A' of FIG. 2(c) illustrating a state that the atmosphere isolation sample holder 7 and the lid 9 are being loaded into the atmosphere isolation unit 10 in the sample exchanger 5, FIG. 2(b) is a sectional view taken along the line B-B' of FIG. 2(c) illustrating a state that the atmosphere isolation sample holder 7 and the lid 9 are loaded in the atmosphere isolation unit 10 in the sample exchanger 5. FIG. 2(c) is a partially transparent sectional view showing what is illustrated in FIG. 2(b) as seen sideways. As shown in FIG. 2(b), the atmosphere isolation unit 10 has a sliding channel 10d for sliding the sample holder 7 and a sliding channel 10b for sliding the lid 9. As for the sliding channels 10b and 10d, 10b is wider than 10d, and both of them vertically communicate with each other through a step 10c. As shown in FIG. 2(a), the sample holder 7 and lid 9 can vertically slide and get in or out of the sliding channels 10d and 10b, Also, by pushing the exchange bar 11 in a direction of the arrow in FIG. 2(c), the sample holder 7 can be slid in an axial direction of the exchange bar 11 up to a predetermined position (sample holder rest) in the sample chamber 4 as shown in FIGS. 3(b) and 3(c). On the other hand, the lid 9 slides together with the sample holder 7 until it comes into contact with a stopper 10a provided at one end of the atmosphere isolation unit 10, and after coming into contact with the stopper 10a, it stays there, so the lid 9 is separated from the sample holder 7 and only the sample holder 7 can be carried to the sample chamber 4.

Figure 3:
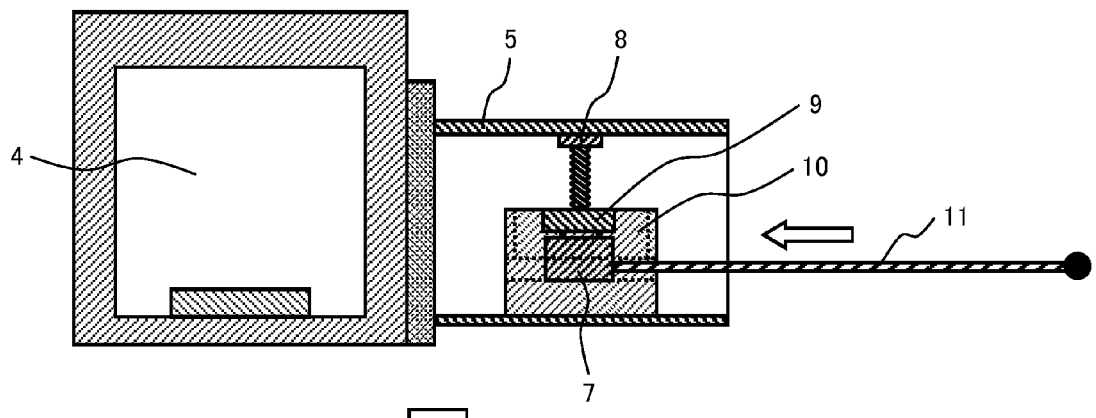
Figure 3:
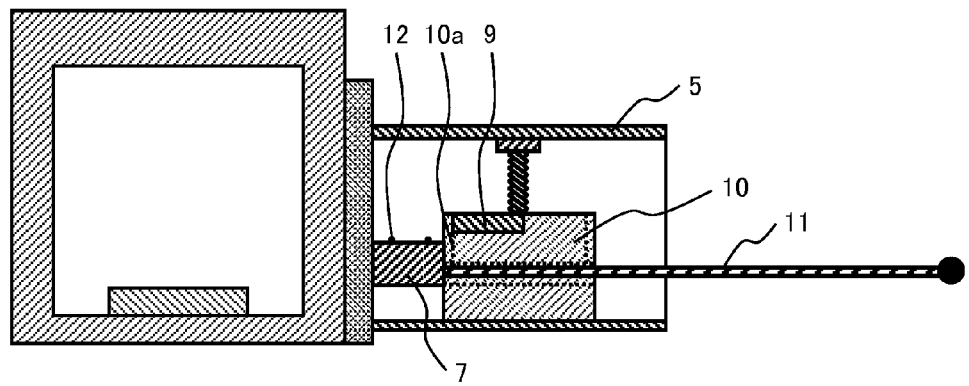
Figure 3:
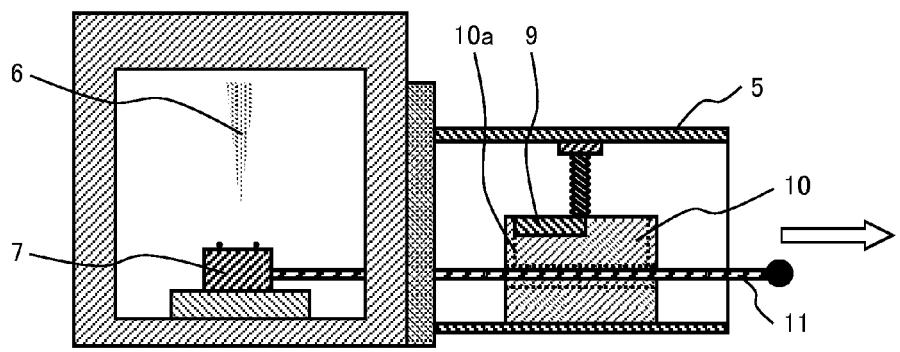

FIG. 3 is a view which explains the operation for carrying the atmosphere isolation sample holder 7 into the sample chamber 4 from the sample exchanger 5. As shown in FIG. 3(a), the atmosphere isolation sample holder 7 and the lid 9 are loaded into the atmosphere isolation sample unit 10 in the sample exchanger 5, after that, the lid 9 is detached from the sample holder 7 by pushing the exchange bar 11 as shown in FIG. 3(b), and only the atmosphere isolation sample holder 7 is carried to the sample chamber 4 by further pushing the exchange bar 11 as shown in FIG. 3(c). After carrying, the sample holder 7 is disengaged from the exchange bar 11 by unscrewing the exchange bar, and the exchange bar 11 is moved away from the sample chamber 4, then processing of the sample is started. Unscrewing is done by combination of the static friction force of the sample holder 7 and the turning torque of the exchange bar 11 in the screw loosening direction.

After processing for the sample with the ion beam 6 in the sample chamber 4 is finished, the exchange bar 11 is again pushed into the screw hole of the sample chamber 4, and the sample holder 7 is screwed onto the exchange bar 11, then the atmosphere isolation sample holder 7 is pulled out by pulling the exchange bar 11 in a direction indicated by the arrow in FIG. 3(c) while keeping the atmosphere isolated from the outside air. Thereby, the lid 9 is again attached to the atmosphere isolation sample holder 7 in the reverse order of the above procedure, as shown in FIG. 3(a).

Figure 4:
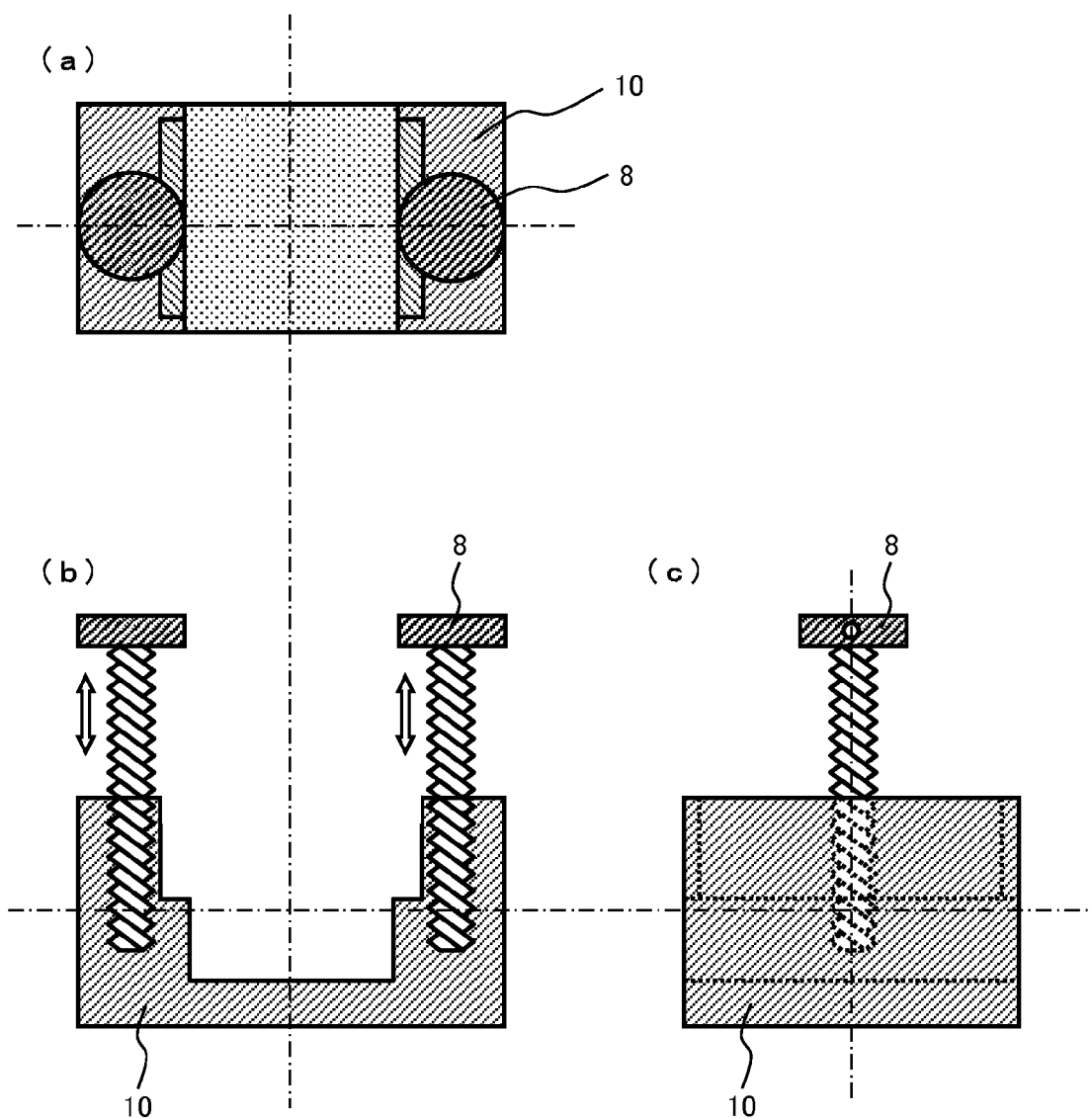

Next, an embodiment of the atmosphere isolation sample unit is illustrated in FIG. 4. The atmosphere isolation sample unit 10 is designed to be fixed in the sample exchanger 5 by the atmosphere isolation unit fixing device 8. The atmosphere isolation sample holder 7 and the lid 9 are attached to or detached from each other through this unit. FIG. 4(a) is a top view of the atmosphere isolation unit 10, FIG. 4(b) is a sectional view of the atmosphere isolation unit 10, and FIG. 4(c) is a side view of the atmosphere isolation unit 10.

Figure 5:
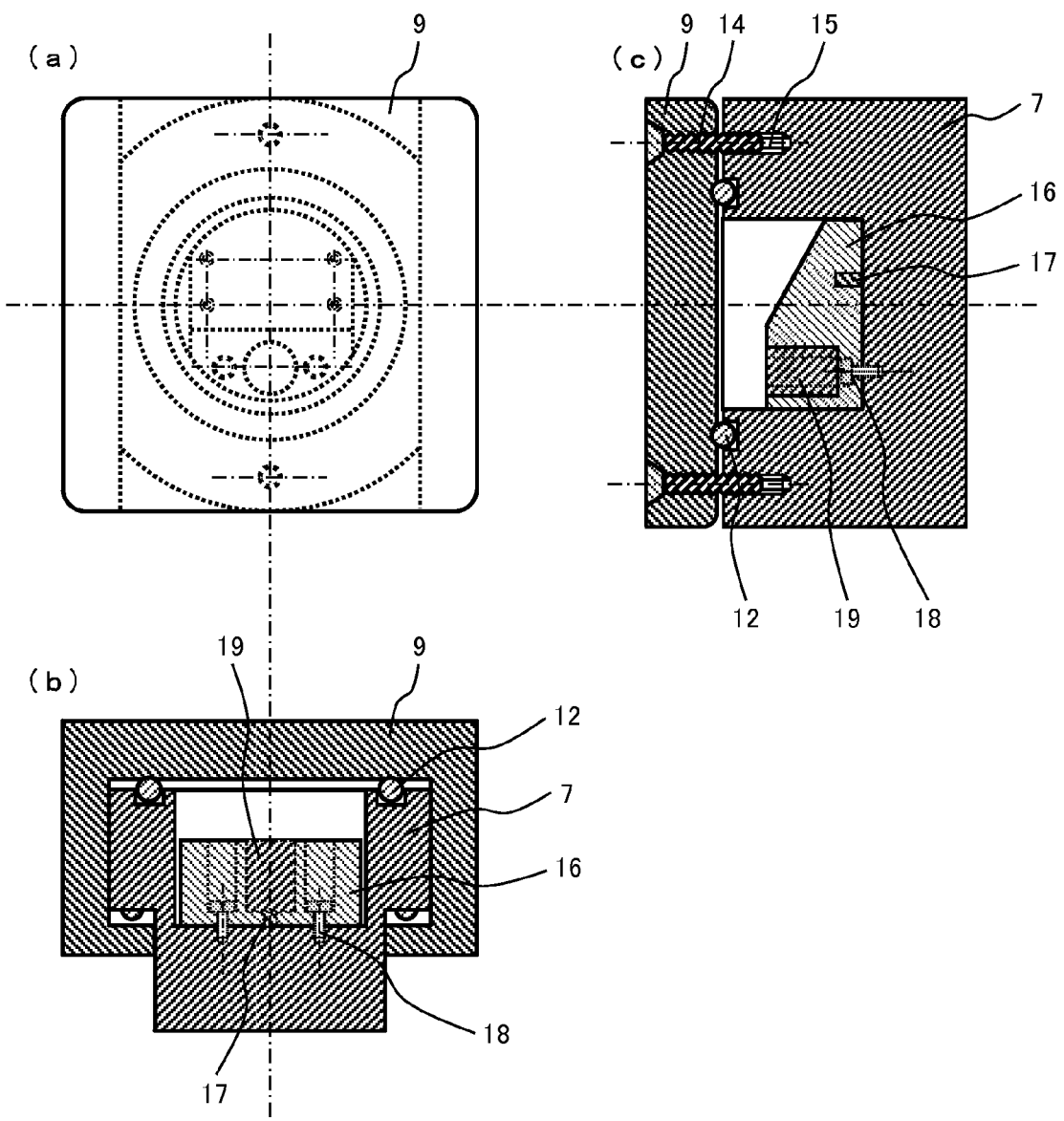

FIG. 5 is a structural diagram of the atmosphere isolation sample holder section. The atmosphere isolation sample holder 7 has an atmosphere isolation O ring 12 for isolating the atmosphere, and which isolates the atmosphere from the outside air between the holder and the atmosphere isolation sample holder lid 9 to maintain the atmosphere of the area in which the sample is loaded. In order to further strengthen the atmosphere insulation, the atmosphere isolation sample holder lid 9 has a structure which can be securely fixed on the atmosphere isolation sample holder 7 by retaining screws 14.

Also the atmosphere isolation sample holder 7 has a structure in which a replaceable sample stage 16 can be loaded, and its position is determined by a replaceable sample stage guide pin 17 and it is fixed by replaceable sample stage fixing screws 18. Furthermore, the replaceable sample stage 16 has a structure which is selectable and replaceable depending on the processed shape and material of a sample. Also the replaceable sample stage 16 has a structure in which a microsample attachment 19 can be loaded. FIG. 5(a) is a top view of the atmosphere isolation sample holder, FIG. 5(b) is a sectional view of the atmosphere isolation sample holder, and FIG. 5(c) is a sectional view of the atmosphere isolation sample holder.

Figure 6:
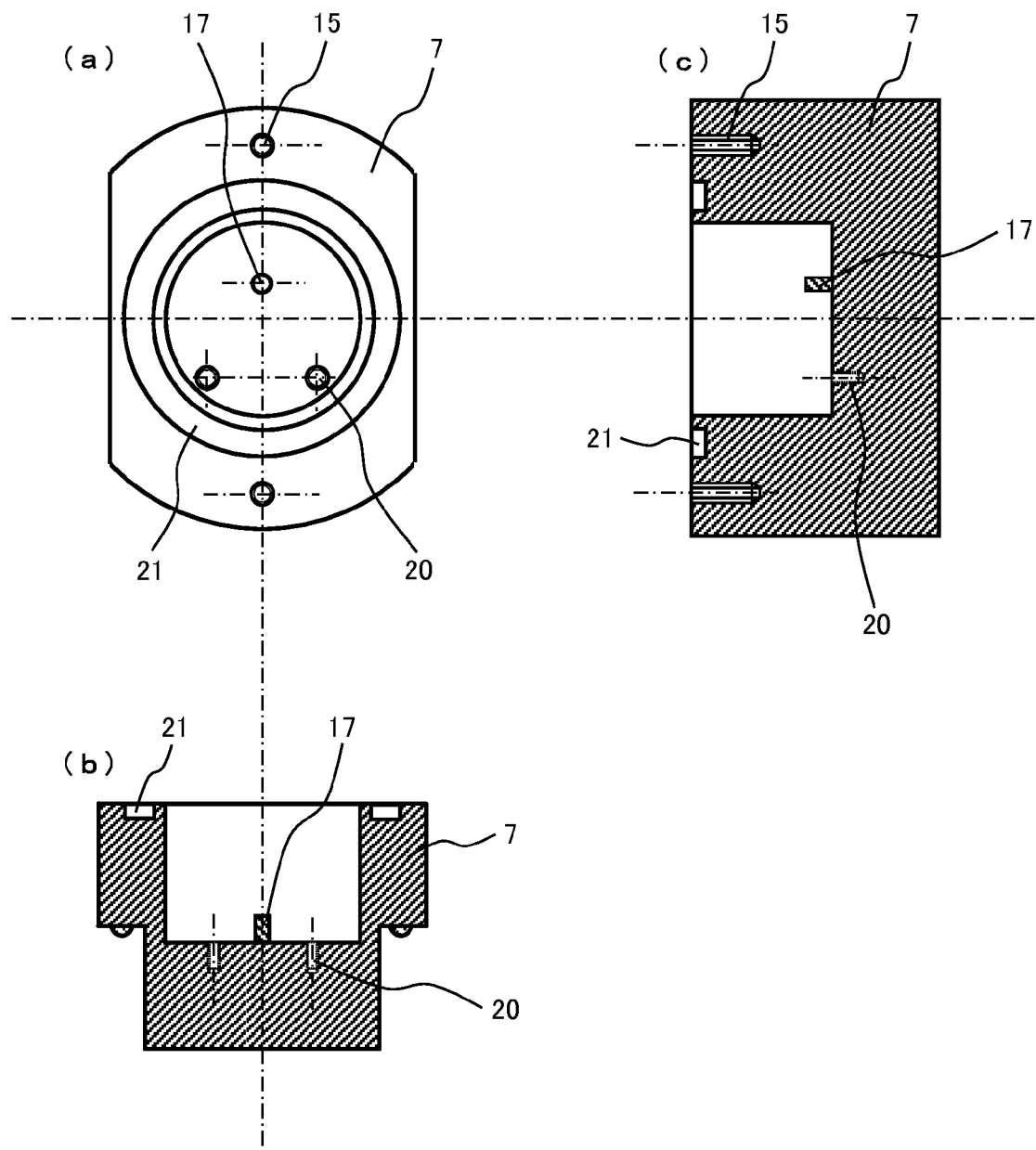

FIG. 6 illustrates another embodiment of the atmosphere isolation sample holder. The atmosphere isolation sample holder 7 in this embodiment has a structure in which the replaceable sample stage 16 (see FIG. 5 and FIG. 7 and subsequent figures) can be loaded. When the replaceable sample stage 16 is loaded into the sample holder, the position where it is fixed is determined by a replaceable sample stage guide pin 17. In addition, the atmosphere isolation sample holder 7 has screw holes 20 for replaceable sample stage fixing screws for fixing the replaceable sample stage 16.

In addition, in order to fix the atmosphere isolation sample holder lid, the replaceable sample stage is provided with screw holes 15 for retaining screws for the atmosphere isolation sample holder lid. FIG. 6(a) is a top view of the atmosphere isolation sample holder, FIG. 6(b) is a sectional view of the atmosphere isolation sample holder, and FIG. 6(c) is a sectional view of the atmosphere isolation sample holder.

Figure 7:
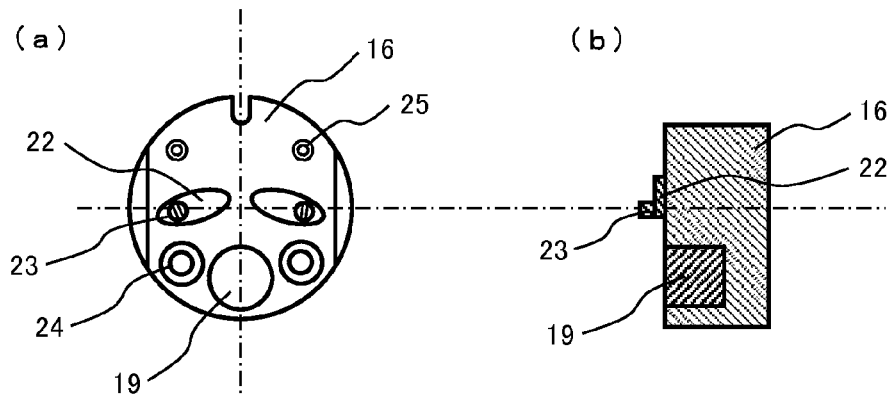

FIG. 7 illustrates an embodiment of the replaceable atmosphere isolation sample stage 16. The atmosphere isolation sample stage 16 has through holes for replaceable sample stage fixing screws, and thereby the stage 16 is fixed in the atmosphere isolation sample holder 7. In addition, the replaceable sample stage 16 has sample retaining plates 22 for fixing an original sample and screws for the sample retaining plates so that positioning for the sample can be done freely by the screw holes 25 for the sample retaining plates.

In addition, a microsample attachment 19 is provided as a member for fixing a microsample and this member is of the cartridge type and replaceable. It is preferable that the material of the member for fixing a microsample is the one which is not an obstacle to elemental analysis and is conductive, such as graphite carbon.

This embodiment is characterized in that the sample plane on which an original sample placed can be flush with the sample plane on which a microsample is placed, and FIG. 7(a) and FIG. 7(b) are a top view and a sectional view of the replaceable sample stage 16 therefor respectively.

Figure 8:
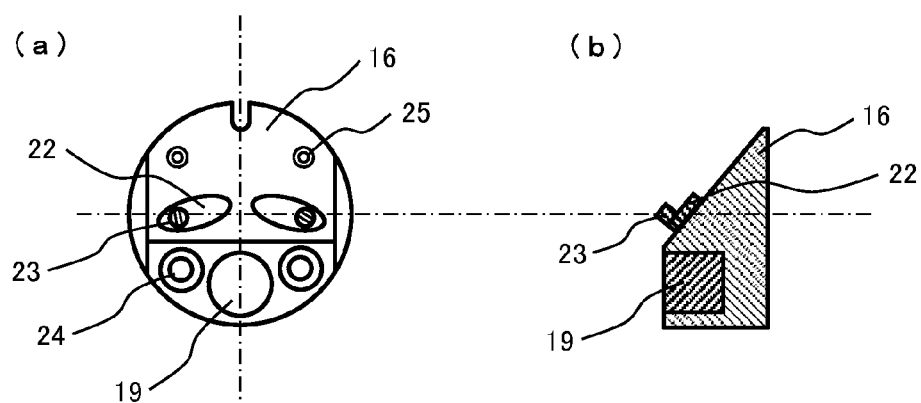

FIG. 8 illustrates another embodiment of the replaceable atmosphere isolation sample stage. FIG. 8(a) is a top view and FIG. 8(b) is a sectional view and the same elements as those shown in FIG. 7 are designated by the same reference signs and their descriptions are omitted. This embodiment is characterized in that the sample plane on which an original sample is placed is inclined with respect to the sample plane on which a microsample is placed.

Figure 9:
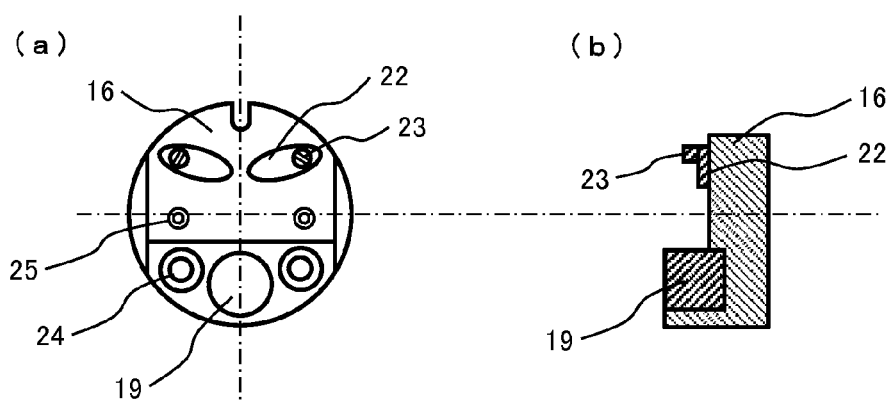

FIG. 9 illustrates a further other embodiment of the replaceable atmosphere isolation sample stage FIG. 9(a) is a top view, and FIG. 9(b) is a sectional view and the same elements as those mentioned above are designated by the same reference signs and their descriptions are omitted. This embodiment is characterized in that the sample plane on which a microsample is placed is a flat plane which is different in height from the sample plane on which an original sample is placed.

Various embodiments have been described so far and any of them makes it possible to keep the atmosphere of the area in which a sample is loaded, in a state isolated from the outside air, for example, a vacuum state or inert gas state and carry out a series of steps from processing of the sample to observation of the sample without exposure to the atmospheric air. So it is easy to process, observe, and analyze the sample even if the sample is a highly active material or a material easily trend to react with moisture and oxygen in the atmospheric air, thereby contributing largely to research and development of novel materials which are expected to be performed in the future.

LIST OF REFERENCE SIGNS

1 . . . FIB housing, 2 . . . Ion gun, 3 . . . Electrostatic lens, 4 . . . Sample chamber, 5 . . . Sample exchanger, 6 . . . Ion beam, 7 . . . Atmosphere isolation sample holder, 8 . . . Atmosphere isolation unit fixing device, 9 . . . Atmosphere isolation sample holder lid, 10 . . . Atmosphere isolation unit, 11 . . . Exchange bar, 12 . . . Atmosphere isolation O ring, 13 . . . Exchange bar screw hole, 14 . . . Retaining screw for atmosphere isolation sample holder lid, 15 . . . Screw hole for retaining screw for atmosphere isolation sample holder lid, 16 . . . Replaceable sample stage, 17 . . . Replaceable sample stage guide pin, 18 . . . Replaceable sample stage fixing screw, 19 ... Microsample attachment, 20 ... Screw hole for replaceable sample stage fixing screw, 21 ... Atmosphere isolation O ring groove, 22 ... Sample retaining plate, 23 ... Screw for sample retaining plate, 24 ... Through hole for replaceable sample stage fixing screw, 25 ... Screw hole for sample retaining plate

The invention claimed is:

1. A sample device for a charged particle beam which delivers a sample between a focused ion beam processing system (FIB) and a scanning electron microscope (SEM), comprising:
   a sample exchanger communicating with a sample chamber of the FIB or a sample chamber of the SEM, and the sample exchanger capable of forming an atmosphere isolated from an outside air therein; and
   an atmosphere isolation sample holder configured to hold the sample while isolating the sample from the outside air with a lid being put on the sample holder;
   wherein the sample exchanger is provided with a lid removing mechanism configured to, when the sample holder with the lid is carried from the sample exchanger into the sample chamber, remove the lid from the sample holder inside the sample exchanger in the atmosphere isolated from the outside air.

2. The sample device for the charged particle beam according to claim 1, wherein the sample exchanger is provided for each of the sample chamber of the FIB and the sample chamber of the SEM.

3. The sample device for the charged particle beam according to claim 1, wherein the sample exchanger includes a mechanism which, according to motion of taking out the atmosphere isolation sample holder, put the lid on the sample holder.

4. The sample device for the charged particle beam according to claim 3, wherein the sample exchanger includes an atmosphere isolation unit which puts the lid on the sample holder and removes the lid from the sample according to sliding motion of the atmosphere isolation sample holder.

5. The sample device for the charged particle beam according to claim 4, wherein the atmosphere isolation sample holder includes a sample exchange bar which moves the sample holder so as to slide the sample holder between the sample exchanger and the sample chamber communicating with the sample exchanger.

6. The sample device for the charged particle beam according to claim 1, wherein the atmosphere isolation sample holder has a sample stage on which both an original sample before the FIB and a microsample after the FIB are placed at the same time.

7. The sample device for the charged particle beam according to claim 6, wherein the sample stage can be attached to or detached from the atmosphere isolation sample holder.

8. The sample device for the charged particle beam according to claim 6, wherein the sample stage has a mechanism which holds the original sample before the FIB and the microsample after the FIB at different heights or inclination angles.

9. The sample device for the charged particle beam according to claim 8, wherein a material of a member for holding the microsample is the one which is not an obstacle to elemental analysis and is conductive, such as graphite carbon.

10. The sample device for the charged particle beam according to claim 1, wherein the atmosphere isolated from the outside air is formed by introducing inert gas and the sample can be processed and observed in the inert gas atmosphere.

11. The sample device for the charged particle beam according to claim 2, wherein the sample exchanger includes a mechanism which, according to motion of taking out the atmosphere isolation sample holder, put the lid on the sample holder.

12. The sample device for the charged particle beam according to claim 11, wherein the sample exchanger includes an atmosphere isolation unit which puts the lid on the sample holder and removes the lid from the sample according to sliding motion of the atmosphere isolation sample holder.

13. The sample device for the charged particle beam according to claim 12, wherein the atmosphere isolation sample holder includes a sample exchange bar which moves the sample holder so as to slide the sample holder between the sample exchanger and the sample chamber communicating with the sample exchanger.

14. The sample device for the charged particle beam according to claim 7, wherein the sample stage has a mechanism which holds the original sample before the FIB and the microsample after the FIB at different heights or inclination angles.

15. The sample device for the charged particle beam according to claim 14, wherein a material of a member for holding the microsample is the one which is not an obstacle to elemental analysis and is conductive, such as graphite carbon.

* * * * *